United States Patent [19]

Tench et al.

[11] Patent Number: 5,178,965

[45] Date of Patent: Jan. 12, 1993

[54] UNIFORM SOLDER COATING ON ROUGHENED SUBSTRATE

[75] Inventors: D. Morgan Tench, Ventura; Dennis P. Anderson, Newbury Park, both of Calif.

[73] Assignee: Rockwell International Corporation, Seal Beach, Calif.

[21] Appl. No.: 837,297

[22] Filed: Feb. 14, 1992

[51] Int. Cl.$^5$ .......................... B32B 3/30; B23K 1/20; B05D 3/10

[52] U.S. Cl. .................................... 428/612; 428/647; 228/203; 427/309; 427/328

[58] Field of Search ............... 428/612, 644, 645, 647; 228/203, 205, 206; 156/666; 427/309, 328

[56] References Cited

U.S. PATENT DOCUMENTS

| | | | |
|---|---|---|---|
| 3,562,039 | 2/1971 | Strohmayer | 228/206 |
| 4,027,055 | 5/1977 | Schneble | 427/309 |
| 4,127,438 | 11/1978 | Babcock et al. | 427/309 |
| 4,373,656 | 2/1983 | Parker et al. | 228/206 |
| 4,767,049 | 8/1988 | Butt et al. | 228/206 |

FOREIGN PATENT DOCUMENTS

| | | | |
|---|---|---|---|
| 50-51425 | 5/1975 | Japan | 228/206 |
| 62-292261 | 12/1987 | Japan | 228/203 |
| 1-170501 | 7/1989 | Japan | 428/612 |
| 1240181 | 7/1971 | United Kingdom | 228/205 |

Primary Examiner—John Zimmerman
Attorney, Agent, or Firm—John C. McFarren

[57] ABSTRACT

A roughened surface of a conductive substrate, such as copper, provides uniform Sn-Pb solder coatings and improved solder retention at printed wiring board (PWB) plated through-hole rims (knees) and surface pads during solder dipping or reflow. A high density of copper surface features of moderate average roughness provides the most favorable solder coating thickness distribution. Various chemical or electrochemical etching processes may be used to produce the desired copper surface topography. Reflowed solder thickness distribution in a PWB knee region attained with a ferric chloride copper etching process peaks at 4 μm, which provides a good margin of safety for preventing exposure/oxidation of the underlying Cu-Sn intermetallics. The ferric chloride copper etching process yields only 1% of solder thickness measurements in the undesirable 0–1.5 μm range for plated through-hole rims. Copper surface roughening is expected to greatly reduce solderability loss in mass produced PWBs. In addition, solder bearing on PWB surface pads is avoided with copper surface roughening so that alignment of surface mount component leads prior to soldering is greatly facilitated.

16 Claims, 2 Drawing Sheets

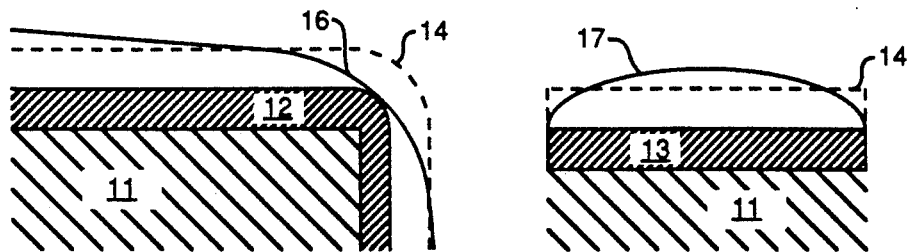
Figure 1A
Prior Art
Figure 1B
Prior Art
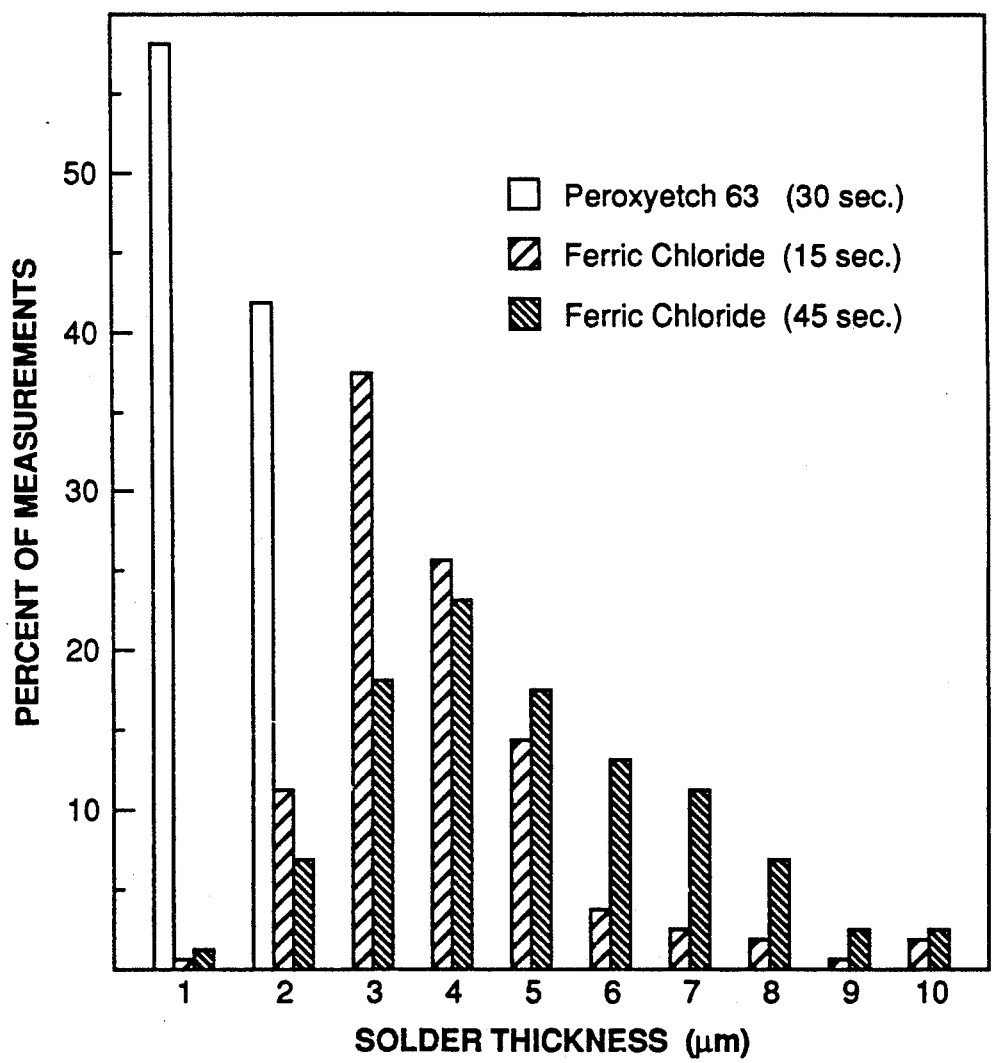
Figure 2

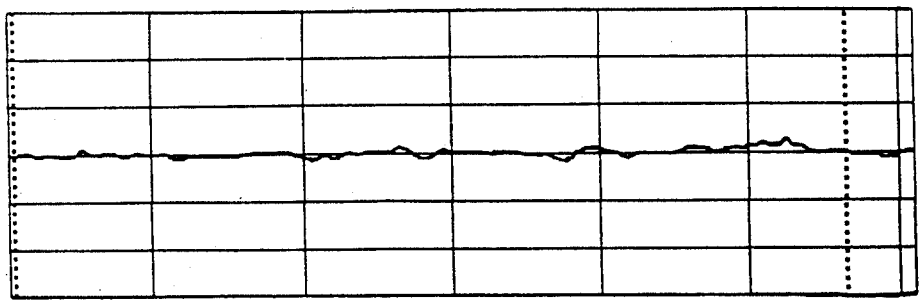
30 sec. Peroxyetch 63
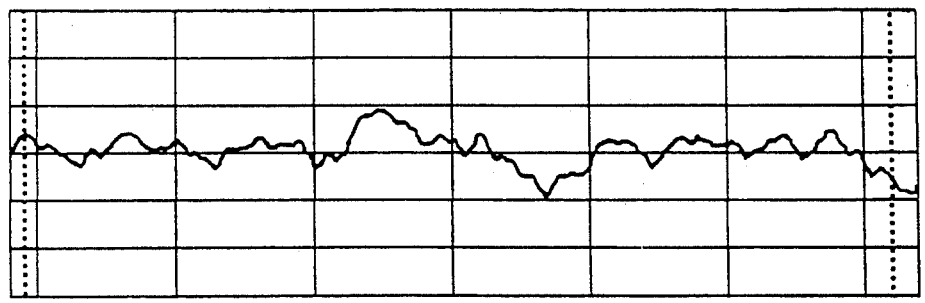
15 sec. Ferric Chloride
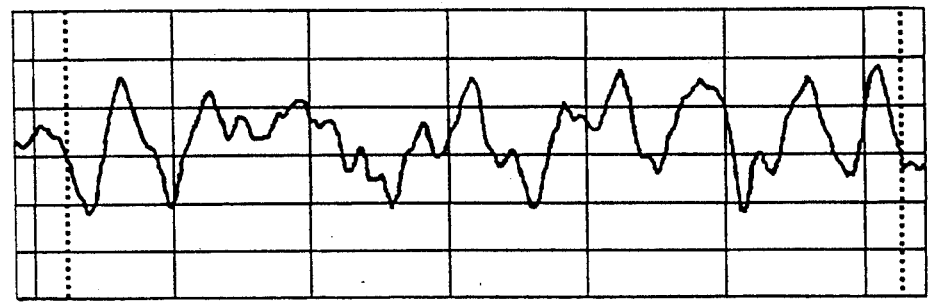
45 sec. Ferric Chloride
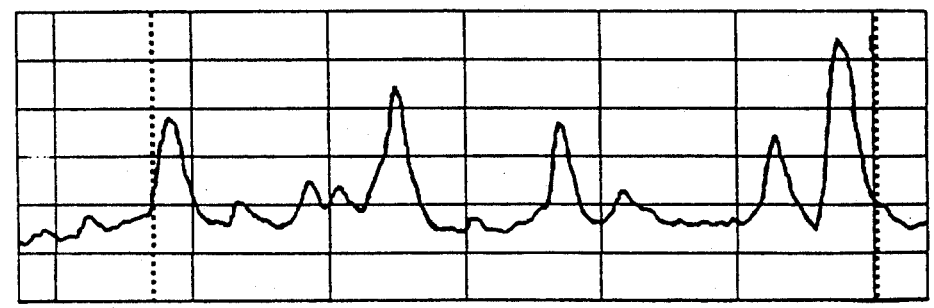
60 sec. Ferric Chloride

UNIFORM SOLDER COATING ON ROUGHENED SUBSTRATE

TECHNICAL FIELD

The present invention relates to soldering of electrical components and, in particular, to a uniform solder coating on a roughened substrate surface.

BACKGROUND OF THE INVENTION

Solder coatings are widely used to protect the conductive substrate (typically copper) of printed wiring board (PWB) circuitry and electronic component leads from oxidation that causes loss of solderability. Solder coatings usually comprise eutectic Sn-Pb solder applied either by hot dipping or electroplating. Electroplated solder coatings are generally densified by subsequent reflowing (melting). Numerous studies and practical experience have shown that solder coatings, when properly applied and sufficiently thick, remain solderable even after several years of normal storage. In the molten state, however, solder tends to flow away from convex areas of the substrate, resulting in localized thinning during solder dipping or reflowing that can lead to loss of solderability of the part during storage. Degradation of solderability is believed to be caused by a combination of tin depletion in the thinned coating, which becomes Pb-rich as tin reacts with the copper substrate to form intermetallic species, and inadequate coverage of the underlying Cu-Sn intermetallic layer, which is unsolderable when oxidized.

Thinning of solder coatings is especially pronounced at PWB plated through-hole (PTH) rims. This condition is commonly referred to as "weak knees." When weak knees become unwettable after storage of PWBs, flow of molten solder into and out of PTHs is inhibited to such an extent that good solder joints cannot be obtained within permissible wave soldering dwell times. In extreme cases, solderability is lost completely.

FIG. 1A illustrates that solder thinning at a plated through-hole knee of PWB 11 during reflow results in a greater radius of curvature for the solder surface. This results because the total area in contact with the vapor phase, and consequently the total solder surface energy, is thus minimized. The knee area is plated with a conductive substrate 12 (typically copper) and a solder coating 14, as shown by a dotted line. Note that the liquid-solid interfacial area is always that of the electrically conductive substrate 12, which remains geometrically constant during the reflow process. During reflow, solder coating 14 assumes a more spherical surface 16 that causes thinning at the knee. The solder liquid-gas surface tension provides the driving force for the thinning process. If the effects of substrate surface roughness and solder inhomogeneities are neglected, surface tension theoretically would continue to act until the solder thickness at the knee is of molecular dimensions. Decreasing the surface tension (or increasing the viscosity) of the solder would decrease the rate of thinning but would not affect the minimum thickness at equilibrium. Such kinetic control of the thinning process is of limited effect because all areas of a large part, particularly a PWB, do not attain thermal equilibrium rapidly or equally. As a result, the actual reflow time, and thus the minimum solder thickness, will vary from area to area of the PWB. Because thin, variable solder coatings result in poor quality connections, there is a need for an effective method of attaining uniform solder coatings on plated through-hole rims of copper printed wiring boards.

Similar to the thinning effect at plated through-hole knees, molten solder tends to bead up on isolated, electrically conductive surface pad 13 on printed wiring board 11. FIG. 1B illustrates that as-plated solder 14 is essentially flat on top of pad 13. During reflow of solder coating 14 on surface pad 13, however, the solder assumes a more spherical profile, or bead 17. Rounded bead 17 can cause difficulty in aligning a component lead wire prior to soldering the wire to pad 13, which is used to connect surface-mount components to PWB 11. This is a serious problem for thin, fine-pitched lead wires, which tend to slide off rounded bead 17. Because the trend in the electronics industry is to use fine-pitched leads for surface-mount components, there is also a need for an effective method of maintaining flat solder coatings on PWB surface pads.

SUMMARY OF THE INVENTION

The present invention comprises a uniform solder coating on a roughened surface of an electrically conductive substrate material, typically copper. The substrate surface is roughened to maintain uniform Sn-Pb solder coatings during solder dipping or reflow. In particular, the roughened surface of the present invention improves solder retention at printed wiring board (PWB) plated through-hole rims (PTHs or knees) and maintains flat, solder-coated PWB surface pads. Optimum copper topography for solder retention at PWB knees was established by correlations with profilometer measurements of copper surfaces following various etch roughening processes. It was discovered that a high density of copper surface features of moderate average roughness provides the most favorable solder coating thickness distribution. For example, the solder thickness distribution in the knee region attained with a ferric chloride copper etching process of the present invention peaks at 4 $\mu$m, which provides a good margin of safety for preventing exposure/oxidation of the underlying Cu-Sn intermetallics. Because the thinnest solder regions are evenly distributed on a microscopic scale, their effect on the wetting characteristics of the overall solder coating is negligible. Conventional copper soldering preparations smooth the copper surface and produce a majority of PWB knees with unacceptably thin ($<1.5$ $\mu$m) solder coatings. With the ferric chloride copper etching process of the present invention, for example, only 1% of the solder thickness measurements in the plated through-hole regions fell within the 0–1.5 $\mu$m range. Thus, the copper surface roughening procedure of the present invention is expected to greatly improve the resistance of production PWBs to solderability loss. Furthermore, solder beading on PWB surface pads is avoided with copper surface roughening so that alignment of surface mount component leads prior to soldering is greatly facilitated.

A principal object of the invention is improved solderability of electrically conductive substrates, particularly copper plated through-hole rims and surface pads of printed wiring boards, by maintaining a solder coating of substantially uniform thickness. A feature of the invention is a surface roughening process prior to coating a conductive substrate with solder. An advantage of the invention is improved solderability of mass produced copper printed wiring boards.

BRIEF DESCRIPTION OF THE DRAWINGS

For a more complete understanding of the present invention and for further advantages thereof, the following Detailed Description of the Preferred Embodiments makes reference to the accompanying Drawings, in which:

FIGS. 1A and 1B are schematic diagrams of an enlarged, solder-coated, copper-plated through hole section and an isolated surface pad, respectively, of a printed wiring board;

FIG. 2 is a histogram showing percent of reflowed solder thickness measurements at printed wiring board through holes for Peroxyetch 63 and ferric chloride copper etch treatments; and FIGS. 3A-D are Dektak Model 3030 profilometer measurements comparing copper surfaces roughened by various etching procedures.

DETAILED DESCRIPTION OF THE PREFERRED EMBODIMENTS

The present invention comprises a uniform solder coating on an electrically conductive substrate (typically copper) that has a roughened surface to improve the equilibrium distribution of molten Sn-Pb solder on the substrate. The most obvious benefit of a roughened surface is retention of solder in recessed areas, which increases the average solder coating thickness. Solder does not flow out of recesses because conformance of the outer solder surface to the roughened substrate would require an increase in surface area and a corresponding increase in surface energy. Thus, solder coverage of the substrate (and conformal intermetallic layers) is enhanced except at protrusions in the substrate, which generally represent only a small fraction of the total surface area. Furthermore, spherical diffusion around copper protrusions enhances the supply of tin so that formation of the Sn-poor intermetallic, $Cu_3Sn$, which is generally believed to be more detrimental to solderability, is suppressed.

Prior art solder preparation methods generally clean and smooth the surface of copper substrates before application of solder coatings. It has been discovered, however, that copper surface roughening, rather than smoothing, enhances the uniformity of dipped or electroplated/reflowed solder, particularly at PWB knees and surface pads. Suitable copper surface roughening methods include chemical etching, electrochemical etching, and chemical or electrochemical oxide formation followed by chemical or electrochemical reduction. The optimum roughening process depends on the form and characteristics of the particular electrically conductive substrate to be soldered. The results of comparison studies of several different copper surface etching processes are described below.

EXPERIMENTAL DETAILS

The copper surface roughening performance of a commonly used solder preparation, Peroxyetch 63 (Chemline Industries), was compared with the performance of a ferric chloride etch at various exposure times. All etch solutions were prepared using reagent grade chemicals and deionized water. The Peroxyetch 63 solution contained 1.4 wt % $H_2O_2$ and 20 wt % $H_2SO_4$. The ferric chloride etch solution contained 253 g/l $FeCl_3$ in 50 vol % HCl.

PWB coupons (approximately 2×10 cm) were cut from a bare-copper circuit board (2 mm thick) produced using a pyrophosphate bath for copper plating. Etch time for a given etchant was varied by increasing the coupon depth of immersion at recorded time intervals. After etching, each coupon was rinsed in deionized water, dipped in 10% $HBF_4$ for 60 seconds, and then electroplated at $-16$ mA/cm$^2$ with 63-37% Sn-Pb solder to an average thickness of 12 μm from a 30-liter fluoroborate/peptone bath (16 g/l $Sn(BF_4)_2$, 9.6 g/l $Pb(BF_4)_2$, 400 g/l $HBF_4$, 0.2 vol % peptone additive, saturated $H_3BO_3$) in a cylindrical fluorocarbon plastic container. The anode comprised two bagged 63% Sn-37% Pb alloy bars placed 16 cm from either side of the cathode. During plating the cathode was mechanically moved back and forth (perpendicular to the coupon surface plane) through a 2.5 cm stroke at 13 cycles/min and the bath was continuously circulated through a 10 μm polypropylene particulate filter cartridge (Serfilco).

Solder reflow was performed by immersion of the coupons in water-soluble oil (Cutech CG21B). The coupons were dipped in unactivated rosin flux for 10 seconds, allowed to drain for 15 seconds, preheated in oil at 136° C. for 60 seconds, reflowed at 220° C. for 10 seconds, cooled in oil at 136° C. for 30 seconds, and then rinsed in deionized water.

For PWB cross-sectional analyses, the reflowed solder was plated with 5-10 μm of copper from a pyrophosphate bath at 55° C. to prevent rounding of the solder edges during polishing. Cross-sections of at least 4 through-holes from each coupon were cut on a diamond saw, mounted in epoxy resin, and polished on a polishing wheel (Struers Planopol-2) until the maximum hole diameter was obtained. The specimens were first exposed to an ammonium persulfate etch for 3 seconds to delineate the Cu, and then etched in nital solution (1.0 ml conc. $HNO_3$ in 25 ml methanol) for 3 seconds to darken the Sn-Pb solder deposit and provide better contrast. Solder thickness measurements were made on a Zeiss metallographic microscope.

Specimens for surface roughness measurements were prepared by plating a flat OFHC copper sheet with 50 μm of copper from a production PWB pyrophosphate bath (55° C.). Coupons (about 1 cm square) were cut from the panel and polished on successively finer aqueous slurries down to 0.05 μm (alumina). While there were quantitative differences, the same trends were observed for unplated OFHC specimens. Profilometer scans were performed at slow speed over a 3 mm length using a Dektak Model 3030 surface profiler with a submicron stylus.

EXPERIMENTAL RESULTS

Photomicrographs (500×) were taken of PWB plated through-hole cross sections after solder reflow to compare copper substrates initially treated with Peroxyetch 63 to substrates treated with ferric chloride etch. After polishing, the reflowed solder deposits were seen as dark areas sandwiched between the PWB copper and the copper overplate that provided sharp boundaries. Because the original, as-plated solder deposit was always found to be of uniform thickness (12 μm), it was evident from the micrographs that the solder thins dramatically in the knee region of PWBs during reflow when Peroxyetch 63 is used to prepare the copper surface. In sharp contrast, the ferric chloride etch of the copper surface produces a uniform solder coating throughout the knee region after reflow.

A statistical approach was used to evaluate the various copper surface preparations. Because of the roughness induced in the copper substrate, the thickness of the solder coating varied from point to point along the knee. The solder thickness was measured every 4 μm over an arc length of 40 μm in regions where the solder deposit was thinnest overall. For each set of copper surface preparations, an average of 20 knees (at least 16) were analyzed. Approximately 200 thickness measurements were obtained. The intermetallic layer formed as a result of the solder reflow conditions was found to be irregular and ill-defined. Therefore, the thickness of the intermetallic layer, which was in the 0.5 to 1 μm range, was not subtracted from the measurements.

FIG. 2 comprises histograms of the percent of measurements for each solder thickness (rounded to the nearest whole μm) for selected etch treatments using Peroxyetch 63 and ferric chloride solutions. For Peroxyetch 63, most of the solder thickness measurements were 1 μm and there were none more than 2 μm. It should be kept in mind that thicknesses as low as 0.5 μm were included in the 1 μm category. Because the use of Peroxyetch 63 produces a relatively smooth copper surface, the thickness of the solder coating is essentially constant in the thinnest region over the knee. The percent of measurements greater than 1 μm for the conventional Peroxyetch 63 process was only about 40%. This result indicates that the use of conventional Peroxyetch 63 copper surface preparation produces PTH knees that have little or no reflowed solder covering the intermetallic layer (which is 0.5 to 1 μm thick) and loss of solderability can be expected, especially as more intermetallics are formed during subsequent processing steps and storage. For the 45 second ferric chloride etch, however, 92% of the solder thickness measurements were 3 μm or more, with a peak in the distribution occurring at 4 μm. Because it is generally recognized that 1 μm of solder coating over an intermetallic layer is adequate to ensure solderability, the ferric chloride etch for roughening the copper surface clearly provides a substantial margin of safety for ensuring solderability.

Experiments have shown that a small fraction of unwettable microscopic areas on an otherwise wettable copper surface has a relatively negligible effect on the solder wetting characteristics. In this case, the wetting angle ($\theta$) is given by:

$$\cos \theta = f_1 \cos \theta_1 + f_2 \cos \theta_2$$

where $f_1$, $f_2$ and $\theta_1$, $\theta_2$ are the area fractions and contact angles, respectively, for the wettable (1) and unwettable (2) areas. As an example, assume that the percentage (1%) of 1 μm coating thickness measurements obtained with a 45 second ferric chloride etch can be considered the percentage of a fully wettable surface (i.e., $\theta_1 = 0$) that has become completely unwettable (i.e., $\theta_2 = 90°$). In this case, the measured wetting angle ($\theta$) would be 8° (instead of 0°). The same analysis applied to the results for the conventional Peroxyetch 63 treatment (where 1 μm comprises 58% of the measurements) yields a value of 55° for wetting angle $\theta$.

Experiments were also conducted to determine the effect of ferric chloride etch time on solder retention at PWB knees. Tests were conducted for etch times of 15, 30, 45, 60, 90, and 120 seconds, with the results for 15 and 45 seconds illustrated in FIG. 2. The results indicated that the optimum etch time for ferric chloride solution is approximately 45 seconds. At 45 seconds, the average thickness of the reflowed solder is greatest and the percentage of low measurements in the 1-3 μm range is a minimum. However, even a 15 second ferric chloride etch provides a substantial improvement over Peroxyetch 63, as shown in FIG. 2. With use of a conventional Peroxyetch 63 copper surface preparation, the copper substrate becomes progressively smoother with etch time, thereby yielding a decrease in the overall thickness of reflowed solder at PWB knees.

FIGS. 3A-D show representative Dektak profilometer scans of copper etched with Peroxyetch 63 (optimum time of 30 seconds) and copper etched with ferric chloride for 15, 45, and 60 seconds, respectively. The profilometer scans were performed at slow speed over a 3 mm length using a Dektak Model 3030 surface profiler with a submicron stylus. In FIGS. 3A-D, each horizontal division is a distance of 50 μm and each vertical division is a distance of 0.5 μm. FIG. 3A illustrates the relatively smooth surface (roughness factor $R_a = 0.026$ μm) of copper treated with Peroxyetch 63. At the profilometer scale used, the copper surface treated with Peroxyetch 63 was essentially indistinguishable from an untreated, as-plated copper surface. FIGS. 3B-D illustrate that treatment with a ferric chloride etch produces a distinctly rougher surface, with $R_a = 0.122$ μm at 15 seconds, $R_a = 0.306$ μm at 45 seconds, and $R_a = 0.308$ μm at 60 seconds. For the purpose of providing a solder coating that maintains its uniformity around PWB knees and on surface pads after dipping or during reflow, a 45 second ferric chloride etch was determined to produce a desirable copper surface roughness.

Copper surface topography, other than merely reflected in the roughness factor, apparently plays a role in solder retention. When etching a copper surface with a ferric chloride solution, the roughness factor ($R_a$) increases with etch time. After 60 seconds of etch time, as illustrated in FIG. 3D, the copper surface structure becomes much more open, dominated by a relatively low density of very sharp and tall peaks (indicative of strongly preferential etching). These protruding peaks are believed to account for the increase in the percentage of 2-3 μm thickness measurements observed at longer etch times (e.g., 60 seconds and above). This implies that the lower "foothill" regions on an etched copper substrate, rather than the highest peaks, determine at average thickness of a dipped or reflowed solder coating.

The substrate surface roughening of the present invention also maintains flat, solder-coated PWB surface pads. The roughened surface inhibits the formation of rounded solder beads on isolated surface pads during solder reflow. Aligning surface-mount component lead wires for soldering to PWB surface pads is facilitated by having a flat soldering surface rather than a rounded solder bead. Solder beads on surface pads, which result from conventional Peroxyetch 63 copper treatment, can cause thin, fine-pitched component lead wires to slide off the rounded surface before they can be soldered.

Experiments with the ferric chloride etch produced an increase in the average reflowed solder thickness that was much greater than expected on purely theoretical grounds. Theoretically, the outer solder surface was expected to approach within molecular dimensions of the micropeaks of the etched copper surface. The thickness measurements, however, showed that the measured distance of closest approach is on the order of micrometers. A possible explanation is that the formation of more Cu-Sn intermetallic compound per geometric area on the roughened copper substrate (as compared with a smooth copper surface) produces significantly greater tin depletion in the molten solder. Thinning would therefore be checked as the resulting layer of off-eutectic solder adjacent to the substrate became pasty or solidified. It should be noted that the actual presence of solder inhomogeneities postulated here would not degrade solderability because the outer solder surface would nevertheless remain nearly eutectic in composition.

The foregoing experiments established the optimum copper topography for solder retention at PWB knees and surface pads by means of correlations with profilometer measurements of copper surfaces after various etching procedures. It was discovered that a high density of uniform features of moderate average roughness (i.e., $R_a$ values of approximately 0.1 to 0.5 $\mu$m) provides the most favorable solder thickness distribution after dipping or reflow. Ferric chloride has been described by way of example, but not limitation, of a chemical etch that produces moderate average surface roughness on a copper substrate. Although use of ferric chloride solution is the preferred method for producing the desired copper surface roughness, other etches and methods are likely to produce satisfactory copper topography for solder retention at PWB knees. It is likely that the optimum etchant and/or etching conditions for copper and other conductive substrates will vary depending on the microstructure (and method of preparation) of the substrate material. For example, the optimum etching process for copper electroplated from acid sulfate is likely to be different than that for copper electroplated from pyrophosphate baths.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

We claim:

1. A method of attaining a uniform solder coating on an electrically conductive substrate, comprising the steps of:
    roughening the substrate surface to an average measured roughness $R_a$ in the range of 0.1 to 0.5 $\mu$m;
    coating said roughened substrate surface with Sn-Pb solder; and
    maintaining said solder coating at a substantially uniform thickness greater than approximately 1.0 $\mu$m on said roughened substrate surface while molten and after reflow.

2. The method of claim 1, further comprising the step of plating a printed wiring board with copper, said plated copper forming said electrically conductive substrate.

3. The method of claim 2, further comprising the step of
    etching the surface of said copper substrate with a solution of ferric chloride to form said roughened substrate surface.

4. The method of claim 3, wherein said etching step comprises etching said copper substrate with a solution comprising 253 g/l FeCl$_3$ in 50 vol % HCl.

5. The method of claim 4, wherein said etching step comprises etching said copper substrate with said ferric chloride solution for less than approximately 120 seconds.

6. The method of claim 2, further comprising the steps of:
    providing said copper plated printed wiring board with copper plated through-hole rims;
    applying said solder coating to said copper plated through-hole rims; and
    maintaining said applied solder coating at a substantially uniform thickness of greater than approximately 1.0 $\mu$m over said through-hole rims while molten and after reflow.

7. The method of claim 6, further comprising the step of etching the surface of said copper plated through-hole rims with a solution of ferric chloride prior to applying said solder coating.

8. The method of claim 2, further comprising the steps of:
    providing said copper plated printed wiring board with copper plated surface pads;
    applying said solder coating to said copper plated surface pads; and
    maintaining said applied solder coating on said surface pads without significant solder beading.

9. The method of claim 8, further comprising the step of etching the surface of said copper plated surface pads with a solution of ferric chloride prior to applying said solder coating.

10. A uniform solder coating on an electrically conductive substrate, comprising:
    a surface of the substrate roughened to an average measured roughness $R_a$ in the range of 0.1 to 0.5 $\mu$m;
    a coating of Sn-Pb solder applied to said roughened substrate surface; and
    said solder coating maintaining a substantially uniform thickness greater than approximately 1.0 $\mu$m on said roughened substrate surface while molten and after reflow.

11. The uniform solder coating of claim 10, wherein said surface comprises copper plated on a printed wiring board and said solder coating maintains a substantially uniform thickness greater than approximately 1.0 $\mu$m on said copper surface while molten and after reflow.

12. The uniform solder coating of claim 11, wherein said printed wiring board includes copper plated through-hole rims and said solder coating maintains a substantially uniform thickness greater than approximately 1.0 $\mu$m on said copper plated through-hole rims while molten and after reflow.

13. The uniform solder coating of claim 11, wherein said printed wiring board includes copper plated surface pads and said solder coating maintains a substantially uniform thickness on said copper plated surface pads without significant solder beading.

14. The uniform solder coating of claim 11, wherein said copper surface is etched with a solution of ferric chloride to roughen said surface.

15. The uniform solder coating of claim 14, wherein said solution of ferric chloride comprises 253 g/l FeCl$_3$ in 50 vol % HCl.

16. The uniform solder coating of claim 15, wherein said copper surface is etched with said ferric chloride solution for less than approximately 120 seconds.

* * * * *